United States Patent [19]

Erhage

[11] Patent Number: 5,631,646
[45] Date of Patent: May 20, 1997

[54] METHOD FOR DETERMINATION OF ERRORS IN ANALOGUE-DIGITAL CONVERSION

[75] Inventor: Lars Erhage, Göteborg, Sweden

[73] Assignee: Telefonaktiebolaget LM Ericsson, Stockholm, Sweden

[21] Appl. No.: 497,050

[22] Filed: Jun. 30, 1995

[30] Foreign Application Priority Data

Jul. 5, 1994 [SE] Sweden .................................. 9402372

[51] Int. Cl.$^6$ .................................................. H03M 1/10
[52] U.S. Cl. .......................................... 341/120; 341/155
[58] Field of Search ........................................ 341/116, 117, 341/120, 111, 155; 342/174; 348/192

[56] References Cited

U.S. PATENT DOCUMENTS

| | | | |
|---|---|---|---|
| 3,950,750 | 4/1976 | Churchill et al. | 343/17.7 |
| 4,003,054 | 1/1977 | Goldstone | 343/17.7 |
| 4,700,222 | 10/1987 | Large et al. | 358/86 |
| 4,875,049 | 10/1989 | Yoshida . | |
| 5,124,708 | 6/1992 | Mackes et al. | 342/174 |
| 5,216,425 | 6/1993 | Erhage . | |

FOREIGN PATENT DOCUMENTS

| | | |
|---|---|---|
| 490275 | 6/1992 | European Pat. Off. . |
| 500507 | 8/1992 | European Pat. Off. . |
| 43 06 880 | 6/1994 | Germany . |

Primary Examiner—Jeffrey A. Gaffin
Assistant Examiner—Jason L. W. Kost
Attorney, Agent, or Firm—Burns, Doane, Swecker & Mathis, L.L.P.

[57] ABSTRACT

Method for determination of time errors in connection with analogue-digital conversion of quadrature detected signals by feeding a special, periodically repeated signal, the frequency of which is changed during each period, to the device whose time errors are to be determined. The special signal is quadrature detected, whereby two quadrature components (I and Q) are formed. The quadrature components are sampled and the samples are converted to digital form, whereby each of the quadrature components are sampled at at least two fixed points of time for each period of the special signal. The samples from a number of periods of the special signal related to the fixed points of time are Fourier transformed in order to generate spectra in which expressions are contained which describe both the fundamental tone of the special signal and its image tone. From the expressions, a relation between the fundamental tone and the image tone is formed and the time error is calculated from the value of the relation for at least two fixed sampling points of time. (FIG. 1)

9 Claims, 1 Drawing Sheet

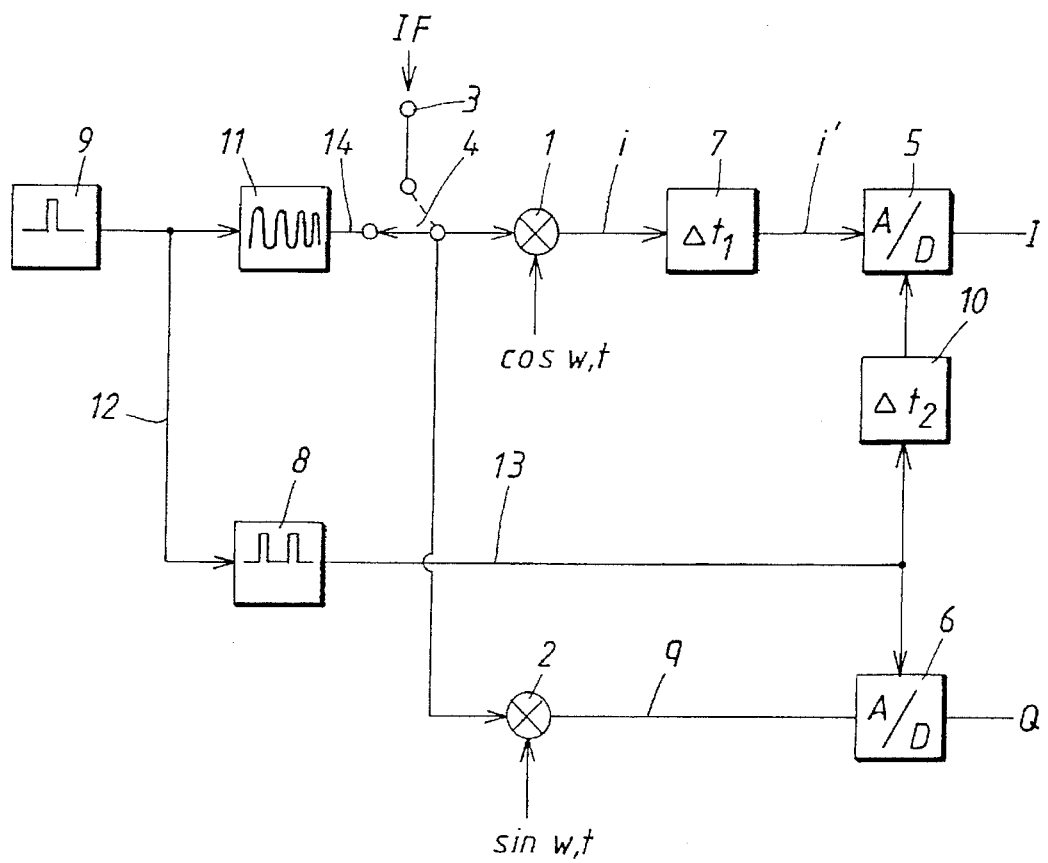
_FIG.1_
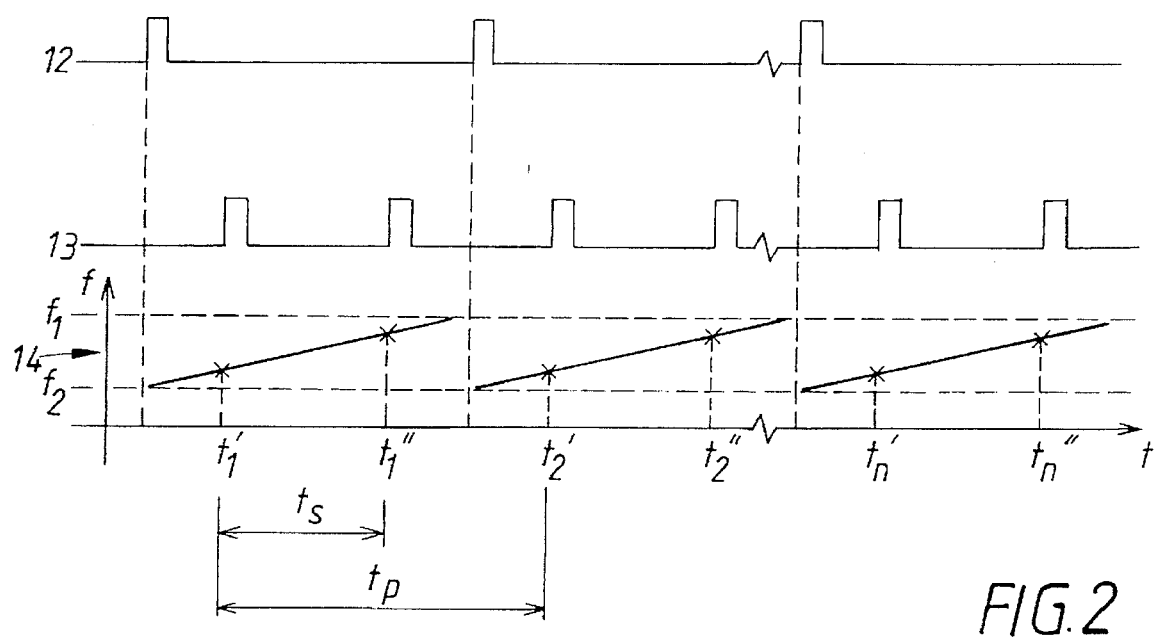
_FIG.2_

METHOD FOR DETERMINATION OF ERRORS IN ANALOGUE-DIGITAL CONVERSION

BACKGROUND

The present invention relates to a method for determining time errors in connection with analogue-digital conversion of quadrature detected signals with the aid of a test signal.

In the areas of radar technology and telecommunication, as well as in other areas, information exists in the form of carrier waves. To extract the transferred information from these signals, the carrier wave signal is demodulated by down conversion in one or several stages. Because the transferred information exists both in the amplitude as well as in the phase of the signal, a simple envelope detection is not enough. The final down conversion is therefore performed in two parallel mixers in which the signal is mixed with two reference signals with a 90° phase difference.

The result is two orthogonal signals that are a complex representation of the information where both amplitude and phase information are preserved. These signals are normally termed I (In phase) and Q (Quadrature). Because modern signal processing almost exclusively uses digital technology, the I and Q signals are converted to digital form in an analogue-digital converter (A/D-converter), whereafter the signal processing is performed.

As the demands on amplitude similarity and phase orthogonality between I and Q are very high in most applications, extremely high demands are put on similarity between the signals paths of I and Q, among others on the A/D-converters. Apart from high demands on the included components, it is often necessary to also determine, in a suitable way, the differences between the signal paths and, for example, make corrections for them in the subsequent signal processing.

As an example of this, reference is made to European patent application EP 0 490 275. In this document, a doppler radar system is described where, with the use of FFT (Fast Fourier Transform), amplification and phase errors are detected in the signal paths. The size of the errors are computed and corrections are made.

However, time errors can also appear in the signal paths, so that the I and Q signals are A/D-converted at different times. This type of error is not treated in the earlier mentioned, known device.

SUMMARY

An object of the present invention is thus to provide a method by which time errors in connection with A/D-conversion of quadrature detected signals can be determined, so that the errors can be corrected, or the errors can be taken into account in the subsequent signal processing.

Said object is achieved by a method according to which a periodic test signal is fed to the device. After the quadrature detection, the test signal is sampled and the quadrature components formed during the detection are analogue-digital converted. Sampling is then done for every cycle of the test signal at at least two determined points of time. Samples from a number of cycles are totalled and Fourier transformed to form expressions that describe both the fundamental tone as well as its image/mirror tone. From these expressions, a relation is formed whose values for at least two determined sampling times are used to calculate the time error.

Said relation can, for example, be formed from the quotient between the expressions that describe the image tone and the fundamental tone of the test signal respectively.

BRIEF DESCRIPTION OF THE DRAWINGS

FIG. 1 shows a block diagram of a device whose time error is to be determined,

FIG. 2 shows in a time diagram the relationship of the test signal to, among other things the sampling pulses of the A/D-converters.

DETAILED DESCRIPTION

The invention will now be described in greater detail with reference to FIG. 1 in Which a device is shown whose time error is to be determined.

The method according to the invention means that a special, periodic signal—the test signal—is inputted into the device, the time error of which is to be determined. The test signal can for example consist of a periodic frequency sweep. After the quadrature detection, the I and Q components of the test signal are sampled. The test signal is sampled for every period (frequency sweep) at least twice at different times, and associated samples from a number of periods/cycles (frequency sweeps) are Fourier transformed to create a spectrum which comprises expressions that describe both the fundamental tone of the test signal as well as its image tone, with regard to both amplitude and phase. Thereafter, a relation is created from the expressions between the image tone and fundamental tone of the test signal, as an example, the quotient between these expressions. The relation is calculated for at least two different sampling time points and from these the time error is calculated.

With the purpose of further illustrating the invention, the device shown in FIG. 1 will be described in greater detail. The device comprises two mixers 1 and 2. The outputs of the mixers are each connected to two A/D-converters 5 and 6. The signal inputs of the mixers are connected to, and normally fed with, an information carrying, carrier modulated signal IF via the connection 3 and switch 4. The switch 4 is then in a state that is indicated with a dotted line in FIG. 1.

A conversion is done in the mixers 1 and 2 with the signals $\cos(\omega_1 t)$ and $\sin(\omega_1 t)$ respectively, which implies that the phase difference between the result from mixer 1 and 2 is 90° and the result becomes a quadrature whose components in FIG. 1 have been referenced with i and q respectively. Due to shortcomings of the A/D-converters 5 and 6, a time error appears between i and q. The time error is symbolised in FIG. 1 with a first time delay means 7 with the delay $\Delta t_1$ that acts on the signal i, and the time delayed signal i is referenced i'.

In connection with the conversion of the signals i' and q from analogue to digital signals, the signals are sampled. The sampling is done in the A/D-converters 5 and 6. Control of the sampling is done with the help of a time controlling means 8 that controls the times for sampling. The control consists of a finite sequence of pulses that is repeated at a rate that is determined by a pulse generating means 9. The pulse generating means 9 consequently controls the time controlling means 8.

The time control is not ideal but is afflicted with a time error symbolized by a second time delaying means 10 with a delay $\Delta t_2$. Together a total time error of $\Delta t_1 + \Delta t_2 = \Delta t$ is obtained between the obtained I and Q-signals at the outputs of the A/D-converters.

For measuring the time error Δt, a special test signal is connected to the mixers 1 and 2 instead of the signal IF. This is done by letting switch 3 adopt the position shown in FIG. 1 whereby a test signal generator 11 is connected to the inputs of the mixers. Test signal generators emit a test signal that consists of a frequency sweep with the slope μ (rad/s²). The test signal is syncronized with the control of the sampling in the A/D-converters 5 and 6 because it is controlled from the common pulse generating means 9.

An example of a time sequence is shown in the time diagram in FIG. 2. The X-axis of the diagram indicates time t and the uppermost sequence shows the time position for the pulses that make up the output signal 12 from the pulse generating means 9. The middle sequence shows, in a corresponding way, the pulses that make up the output signal 13 from the time controlling means 8. In this example, i' and q are sampled two times for every pulse from the pulse generating means 9. The sampling is done at the times $t'_n$ and $t''_n$ respectively where n indicates the ordinal of the frequency swept test signal. For every frequency sweep, the times $t'_n$ and $t''_n$ each occur individually at the same time distance from the beginning of the sweep.

The lowest part of the diagram, whose Y-axis indicates frequency, shows the test signal 14. As has been mentioned earlier, this signal is made up of a frequency sweep. In the shown example the frequency is swept between the frequency values $f_1$ and $f_2$, and the start of the frequency sweep is syncronized with the pulses of the signal 12.

The test signal contains a linear positive frequency sweep which means that the input signal can be written as:

$$e^{j(\omega_2 t_p + \frac{1}{2}\mu t^2)}$$

where $\omega_2$ is the carrier frequency of the test signal;

$t_p$ is the time between the pulses from the pulse generating means (=time between two associated samples (for example $t'_n - t'_1$));

t is the time between samples and the pulse from the pulse generating means (=the start of the frequency sweep);

μ is the slope of the frequency sweep $(2\pi(f_2-f_1)/t_p)$.

The mixing with $\omega_1$ in the mixers 1 and 2 means that the down converted input signal can be written as:

$$e^{j\Theta} = e^{j(\omega \cdot t_p + \frac{1}{2}\mu t^2)}$$

where $\omega = \omega_2 - \omega_1$. ω is consequently the "fundamental angular frequency" of the test signal.

Using Euler's identity and with consideration taken to the time error Δt in the I-channel, the signals I and Q can therefore after A/D-conversion be depicted in the following manner:

$$I = \frac{1}{2} \{ e^{j(\omega t_p + \Delta t \cdot \omega + 1/2 \cdot \mu (t+\Delta t)^2)} + e^{-j(\omega t_p + \Delta t \cdot \omega + 1/2 \cdot \mu (t+\Delta t)^2)} \}$$

and $$jQ = \frac{1}{2} \{ e^{j(\omega t_p + 1/2 \mu t^2)} - e^{-j(\omega t_p + 1/2 \mu t^2)} \}$$

If the expressions $C^+$ and $C^-$ are introduced as $$C^- = \frac{1}{2} \{ e^{-j(\Delta t \cdot \omega + t \cdot \mu \cdot \Delta t + 1/2 \mu (\Delta t)^2)} - 1 \}$$

and $$C^+ = \frac{1}{2} \{ 1 + e^{j(\Delta t \cdot \omega + t \cdot \mu \cdot \Delta t + 1/2 \mu (\Delta t)^2)} \}$$

the complex signal I+jQ can be written as $$I + jQ = e^{j(\omega \cdot t_p + 1/2 \mu t^2)} \cdot C^+ + e^{-j(\omega \cdot t_p + 1/2 \mu t^2)} \cdot C^-$$

$C^+$ and $C^-$ are independant of $t_p$, which means that if a number of I- and Q-sample are collected for the time points $t'_1, t'_2, \ldots t'_n$ and for the time points $t''_1, t''_2, \ldots t''_n$ and a Fourier transform is done, a spectrum is attained where $C^+$ and $C^-$ define the amplitude and phase of the fundamental tone and image tone respectively. Letting $$\delta = \Delta t \cdot \omega + t \cdot \mu \cdot \Delta t + \frac{1}{2} \mu (\Delta t)^2$$

the following quotient is formed:

$$k = \frac{C^-}{C^+} = \frac{e^{-j\delta} - 1}{1 + e^{j\delta}}$$

The quotient is thus an expression that describes the relationship between the image tone and the fundamental tone. If the time error Δt is small, one can approximate $e^{j\delta}$ to 1+jδ, i.e. k≈0.5j·δ. As Δt is small, the term $0.5 \mu (\Delta t)^2$ in the expression for δ can be neglected, whereby the following expression is obtained $$k = -j \frac{1}{2} (\Delta t \cdot \omega + t \cdot \mu \cdot \Delta t)$$

By calculating the k-values (k' and k") that correspond to the sampling time points $t'_1 \ldots t'_n$ and $t''_1 \ldots t''_n$ respectively, one obtains $$\Delta t = \frac{-2j(k' - k'')}{\mu \cdot t_s}$$

where $t_s$ is the time between the samples during every cycle of the test signal (for example $t''_1 - t'_1$).

The time error Δt can thus be estimated with the help of the unreal parts of k' and k" and the frequency change of the test signal between the sampling time points.

The thus measured/calculated time error can for example be fed back to the A/D-converter for controlling a delay function for elimination of the time error.

In the described embodiment of the invention a test signal with a linearly increasing frequency has been used. The method can also be used for other types of test signals. For example, it can be a linearly decreasing frequency or a step by step changing frequency between a number of known frequencies whereby the sampling is done at different frequencies.

By sampling at more than two points in time per test signal cycle/period, a more accurate measuring result can be attained by taking the average value of the attained time errors.

The time distance between the sampling occasions should be both adapted to the bandwidth of the subsequent A/D-converter, as well as be chosen so that the frequency change of the test signal between the samples becomes as large as possible, whereby a better signal/noise relationship is attained.

The invention is not restricted to the above described embodiments, but can be varied within the scope of the appended claims.

What is claimed is:

1. A method for determining time errors in connection with analogue-digital conversion of quadrature detected signals, comprising the steps of:

feeding over a number of time periods a periodically repeated signal, whose frequency is changed during each time period, to a device whose time error is to be determined;

quadrature detecting the signal, whereby two quadrature components are formed;

sampling the quadrature components to obtain samples and converting the samples to digital form, whereby the quadrature components for every time period of the signal are each sampled at at least two different time points;

Fourier transforming the samples associated with one of the different time points from a number of time periods of the periodically repeated signal and Fourier transforming the respective samples for each different time point to form spectra, each of which contain expressions that describe a fundamental tone and that describes an image tone of the signal; and forming a relationship, for each different time point, between respective fundamental tone and respective image tone based on the expressions of each respective different time point; and determining the time error based on the formed relationships of at least two different time points.

2. The method of claim 1, wherein the periodically repeated signal comprises a linear frequency sweep.

3. The method of claim 2, wherein the linear frequency sweep goes from a lower frequency towards a higher frequency.

4. The method of claim 2, wherein the linear frequency sweep goes from a higher frequency towards a lower frequency.

5. The method of claim 1, wherein the frequency of the, periodically repeated signal is changed step by step between a number of known frequencies during each period time.

6. The method of claim 1, wherein the expressions describe the fundamental tone and image tone of the special signal with regard to amplitude and phase.

7. A method for determining time errors in connection with analogue-digital conversion of quadrature detected signals, comprising the steps of:

feeding a periodically repeated signal, whose frequency is changed during each period, to a device whose time error is to be determined;

quadrature detecting the signal, whereby two quadrature components are formed;

sampling the quadrature components and converting the samples to digital form, whereby the quadrature components for every period of the signal are each sampled at at least two different time points;

Fourier transforming those samples from a number of periods of the signal associated with the determined time points to form a spectrum which contains expressions that describe a fundamental tone of the signal and an image tone; and determining the time error based on at least two time points according to a relationship between the fundamental tone and the image tone based on the expressions, wherein the expressions describe the fundamental tone and image tone of the signal with regard to amplitude and phase, and the expressions are $$\frac{1}{2}\{1+e^{j(\Delta t \cdot \omega + \mu \cdot \Delta t + 1/2 \cdot \mu(\Delta t)^2)}\} \text{ and } \frac{1}{2}\{e^{-j(\Delta t \cdot \omega + \mu \cdot \Delta t + 1/2 \cdot \mu(\Delta t)^2)} - 1\}$$

where $\Delta t$ is the time error, $\omega$ is an angular frequency of the signal, t is a time distance between a start time point of the signal and the sampling time points and $\mu$ is an angular frequency change of the signal per time unit.

8. The method of claim 7, wherein the relationship is made from a quotient between the expressions.

9. The method of claim 8, wherein the time error $\Delta t$ is determined according to an expression $$\Delta t = \frac{-2j(k'-k'')}{\mu \cdot t_s}$$

where k' and k'' are values of the relationship for sampling time points $t_{1'} \ldots t_{m'}$ and $t_1'' \ldots t_n''$ respectively, $\mu$ is an angular frequency change of the signal per time unit and $t_s$ is a time distance between the samples during each period of the signal.

* * * * *

UNITED STATES PATENT AND TRADEMARK OFFICE
CERTIFICATE OF CORRECTION

PATENT NO. : 5,631,646
DATED : May 20, 1997
INVENTOR(S) : Lars ERHAGE

It is certified that error appears in the above-indentified patent and that said Letters Patent is hereby corrected as shown below:

[57] Abstract, lines 18-19, please delete "(FIG. 1)".

Column 2, line 10, after "things", please insert --,--.

Column 2, line 16, please delete "Which" and insert therefor --which--.

Column 4, line 9, please delete "independant" and insert therefor --independent--.

Column 5, line 22, please delete "and".

Column 5, line 38, please delete ",".

Column 5, line 40, please delete "period time" and insert therefor --time period--.

Column 5, line 42, please delete "special".

Column 6, line 38, please delete "$t_1,...,_m,$" and insert therefor --$t_1'...t_n'$--.

Signed and Sealed this

Fourteenth Day of October, 1997

Attest:

BRUCE LEHMAN

*Attesting Officer*   *Commissioner of Patents and Trademarks*